United States Patent [19]

Luke et al.

[11] 4,023,412

[45] May 17, 1977

[54] METHOD AND APPARATUS FOR DETECTING TEMPERATURE VARIATION UTILIZING THE CURIE POINT OF A FERROMAGNETIC MATERIAL

[75] Inventors: Robert J. Luke, Upton-by-Chester; Ronald C. Robson, Wirral, both of England

[73] Assignee: Shell Oil Company, Netherlands

[22] Filed: July 8, 1975

[21] Appl. No.: 594,161

[30] Foreign Application Priority Data

July 10, 1974 United Kingdom ............ 30495/74

[52] U.S. Cl. .................. 73/362 CP; 73/40.5 R; 324/52; 340/227 C
[51] Int. Cl.² ................ G01R 31/11; G01K 7/38
[58] Field of Search .................. 324/52; 324/54; 73/362 CP, 40.5 R; 340/227 C

[56] References Cited

UNITED STATES PATENTS

| 2,615,973 | 10/1952 | Heath | 73/362 CP X |
|---|---|---|---|
| 2,926,343 | 2/1960 | Postal | 73/362 CP UX |
| 3,211,002 | 10/1965 | Franklin | 73/362 CP |
| 3,418,207 | 12/1968 | Becker et al. | 324/52 X |
| 3,510,762 | 5/1970 | Leslie | 324/52 |
| 3,588,689 | 6/1971 | Crawford | 324/52 |

*Primary Examiner*—Gerard R. Strecker
*Attorney, Agent, or Firm*—Pravel, Wilson & Gambrell

[57] ABSTRACT

A method and apparatus for detecting a temperature variation above or below a predetermined value by providing in the area where the temperature variation is to be detected an electrical circuit comprising at least two parallel conductors. The conductors are insulated from each other by a dielectric material and have positioned between them a quantity of a magnetically soft ferromagnetic material having a Curie point approximately equivalent to the predetermined temperature. By transmitting a pulse along said circuit and measuring the time interval before a reflection of the said pulse is detected, the location of a temperature variation can be detected.

30 Claims, 6 Drawing Figures

METHOD AND APPARATUS FOR DETECTING TEMPERATURE VARIATION UTILIZING THE CURIE POINT OF A FERROMAGNETIC MATERIAL

The present invention relates to a method for detecting temperature variation above or below a predetermined value; to a cable suitable for use in this method; to a method for manufacturing such a cable; to apparatus for detecting said temperature variation, as well as to some particular applications of the said cable.

According to the present invention a method for detecting temperature variation above or below a predetermined value comprises transmitting an electrical signal of short duration along an electrical circuit provided in thermal contact with the area where the temperature variation is to be detected, which circuit comprises at least two substantially parallel conductors insulated from each other and having positioned between them ferromagnetic material have a Curie point about equal to the predetermined temperature; detecting a reflection of the electrical signal and measuring the time interval between transmitting the signal and detecting the reflection thereof.

When an electrical signal of short duration, such as a pulse of voltage, is launched from one end of a line it travels along the said line at a speed approaching that of light. If the pulse encounters an impedance discontinuity some or all of the said pulse will be reflected back from the area of the discontinuity. If there is no such discontinuity along the line, the pulse is not reflected until it has travelled to the end of the line where either an open or closed circuit condition can exist acting as an impedance discontinuity. The pulse is therefore reflected back from the end of the line.

Similarly, if an area of increased magnetic permeability is created at some point along the line, the pulse will see it as a discontinuity and some or all of the pulse will be reflected back from that point, depending upon the increase in permeability. Any non-reflected pulse will continue along the line as far as a further discontinuity, such as the end of the line.

BRIEF DESCRIPTION OF THE DRAWINGS

The present invention will be more easily understood from the following description when taken in conjunction with the attached drawing in which.

Figure 1:
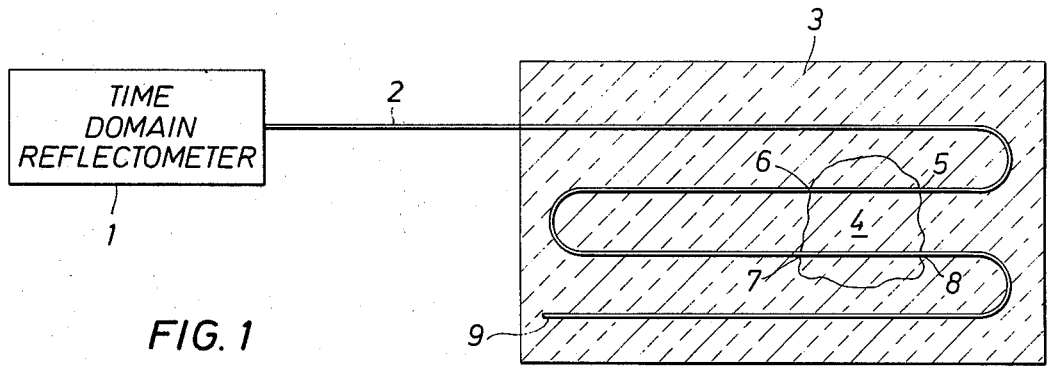
FIG. 1 illustrates the apparatus attached to an insulating system having a leak therein.

A known phenomenon associated with ferromagnetic materials is the very large change in magnetic permeability at a temperature identified as the Curie point, from being ferromagnetic to being paramagnetic or vice versa.

When an electrical circuit comprising at least two parallel conductors, insulated from each other and having positioned between them a quantity of a ferromagnetic material, is maintained at a temperature above the Curie point of the said ferromagnetic material, the material will be paramagnetic and if a short pulse of voltage is launched along the circuit no magnetic field will be created and the pulse will travel to the end of the circuit before it is reflected. The time taken for the pulse to travel to the end and back again can be measured. If at some point along the circuit the said ferromagnetic material is subjected to a sufficiently low temperature so as to cool it below its Curie point it will, at that point, become ferromagnetic and its magnetic permeability will be greatly increased. An area of increased magnetic permeability will be seen by a short pulse of voltage launched along the circuit as an impedance discontinuity and, dependent upon the size of the increase in magnetic permeability, some or all of the pulse will be reflected back therefrom. The time taken for the pulse to travel along the circuit as far as the discontinuity and back again can be measured and compared with the time measured for the pulse to travel the full length of the circuit and back. From the two measurements the distance along the circuit of the magnetic discontinuity and hence the area of reduced temperature can be calculated. From the size of the peak reflected from the discontinuity, and that reflected back from the end of the circuit, an idea of the magnitude of both the temperature reduction and the length of circuit affected can be gained. If the pulse is sufficiently large or the discontinuity sufficiently small subsequent discontinuities can also be identified and measured.

If a discontinuity is large all of the incident pulse may be reflected, thus preventing detection of any discontinuity beyond it. There are two solutions to this drawback. One is to temporarily "erase" the reflection by putting a suitably shaped permanent magnet alongside the length of cable at the cold spot itself. This has the effect of reducing the permeability of the ferrite to a very low value. The second is to launch the pulse from the opposite end of the line.

Similarly, a change from the ferromagnetic state to the paramagnetic through a ferromagnetic material being warmed to a temperature above its Curie point, can also be detected and the position in a circuit at which the increase in temperture has been detected can be identified and measured.

Such an electrical circuit is advantageously in the form of a cable.

Equipment for launching a suitable short pulse of voltage along a circuit, detecting its return and measuring the time elapsed is commercially available in the form of a Time Domain Reflectometer, such as the Model 1501, manufactured by Textronix Incorporated of America. Using equipment such as this, the repetitive sampling technique can be employed, if required, from both ends of the cable, which enables an accurate positioning of the discontinuity to be made and a visible display or permanent record to be obtained.

The most suitable ferromagnetic materials we have so far discovered are those magnetically soft materials, such as ferrimagnetic oxides generally identified as soft ferrites. In particular, the magnetically soft ferrite materials having a cubic crystal structure are especially useful. These materials have the structure of the mineral spinel and are sometimes referred to as spinel ferrites. They have the general formula $MeFe_2O_4$, where Me usually represents one or, in mixed ferrites, more than one of the transition metals Mn, Fe, Co, Ni, Cu and Zn, or Mg and Cd. Other combinations of equivalent valency are possible and it is possible to replace some or all of the trivalent iron ions with other trivalent metal ions. For the present application manganese zinc ferrites (MnZn ferrite) or nickel zinc ferrites (NiZn ferrite) are most suitable. The magnetic properties of these spinel ferrites arise from interactions between metallic ions occupying particular positions relative to the oxygen ions in the crystal structure of the ferrite. Full details of ferrite materials of this type and of various others, together with a discussion of their magnetic properties can be found in the publication "Soft Ferrites" Properties and Applications by E. C. Snelling, B.Sc.(Eng), C.Eng, F.I.E.E., published by Iliffe Books Limited, London. Soft ferrites are known having Curie points between −50° C and +350° C and a material having a particular predetermined temperature for the present use may be selected from the tables of recorded data.

An electrical circuit according to the present invention comprises at least two parallel conductors, insulated from each other and having positioned between them a quantity of ferromagnetic material. A suitable circuit may comprise a cable which may be in the form of two parallel conductors insulated from each other by a dielectric material and having positioned between them and insulated from them a magnetically soft ferromagnetic material. A preferred form of cable according to the present invention is a co-axial cable having a central conductor, which cable comprises for instance a copper wire or a steel wire having its surface plated with copper or other good conductor, surrounded by an insulation comprising a dielectric material, such as polyethylene, further surrounded by a second conductor which preferably is in the form of a woven tubular screen or a metal tube and having between the two conductors a quantity of ferromagnetic material. The ferromagnetic material may be present in the form of beads threaded over the inner conductor. Advantageously, the ferromagnetic material can be a powdered soft ferrite material which can be either homogeneously dispersed within the dielectric material of the insulation or deposited as a layer, possibly together with an adhesive, on the surface of one of the conductors. In the case of the preferred co-axial form of cable the soft material can be deposited on the surface of the central conductor and covered with a layer of insulation material.

Manufacture of cable for use with the method of the present invention can be carried out using any of the known methods of cable manufacture. In order to ensure that the finished cable is as responsive to temperature change as possible, it is necessary to have as high a concentration as possible of the ferromagnetic material in the close proximity of the conductor along which the pulse is launched, without causing too great an increase in overall impedance of the cable.

To thread a large number of ferrite beads into a co-axial cable is not a very practical means of construction. The cable would be expensive, because standard cable production methods could not be exploited. There would also be the risk of breaking the brittle beads, and introducing unwanted discontinuities. Another construction of the cable would consist of loading the insulation material with ferromagnetic material. Soft ferromagnetic material (e.g., ferrite material) can be homogeneously dispersed, as particles having a diameter between 3 and 10 microns ($\mu$) in the dielectric prior to the extrusion of the latter. The powder might be evenly dispersed in melted polythene by standard procedures and then pelletized. The pelletized material might then be used for making the cable by standard methods. It has been found that dispersion of ferrite powder throughout the polythene insulation of the cable, renders the latter much more lossy than a standard unloaded cable, with the result that it would be more difficult to detect temperature variations at large distances. Therefore, in the case of long cables preferably the particulate material will be mixed with a solvent and an adhesive and coated directly onto the surface of a conductor. The coating procedure can be assisted by maintaining a constant current (e.g., 10 Amps.) through the conductor whilst it is being coated. This method will tend to produce a coating of substantially constant thickness. A further method of supplying the soft ferromagnetic material at a high concentration without increasing the overall impedance too much is to extrude onto a conductor a relatively thin layer of a dielectric (e.g., polyvinyl chloride) having homogeneously dispersed therein a very heavy loading of particulate material, such that if only this material were used the cable insulation would be too brittle for reasonable use and would have too high an impedance, and then to extrude around this, a relatively thick layer of a dielectric having no ferromagnetic material dispersed therein and therefore being more flexible.

For use under conditions of extremely high temperatures a fire-proof cable can be constructed comprising an aluminium or copper central conductor surrounded by a powdered dielectric, such as magnesium oxide having dispersed in it a quantity of particulate ferrite material, the whole being contained within an outer tube of stainless steel, aluminium or copper acting as the second conductor. The ferrite material can be coated onto the central conductor as discussed previously rather then mixed with the dielectric if preferred. Similarly, in other cable constructions, such as those having either an oil or a gel as the dielectric insulation medium, the magnetically soft ferromagnetic material can be suspended in the (oil or gel) dielectric in some suitable manner or preferably can be coated onto the central conductor and the cable then manufactured as usual.

The present invention can be further illustrated and explained by reference to examples of use to which the method and the apparatus can be put, which are hereafter described and illustrated with reference to the accompanying drawings.

A first use for the present method and apparatus is to detect failures in insulation systems surrounding cold materials which can lead to the formation of cold spots. This is a particularly important use, especially when the insulation in question is surrounding a cryogenic material and leakage of cold through the insulation could lead to the outside container wall becoming subjected to cryogenic temperatures and cracking. More particularly a system of cryogenic insulation exists where the material of the insulation (e.g., polyurethane foam) acts as the actual container for a cryogenic liquid and failures in the insulation could allow cracks to form through which cryogenic liquid could flow, perhaps even into contact with the outside container wall. The present invention provides a method by which such failures in the insulation can be detected at a very early stage and moreover can be measured and monitored.

A circuit according to the present invention can be installed either in the form of a cable within the insulation itself or in contact with either the inside or outside of the outer container wall. Alternatively, the outer container wall can comprise one of the parallel conductors. Whilst the temperature in the vicinity of the circuit is above the predetermined temperature a short pulse of voltage launched along it from one end will travel to the other end, from which it will be reflected, without being interfered with on the way. If a failure occurs in the insulation at any point, cold will flow through it cooling the circuit at the point nearest to the failure. The ferromagnetic material will be cooled to below its predetermined Curie point and cause an area of increased magnetic permeability to be created at that point. If a short pulse of voltage is subsequently launched along the circuit it will be reflected either partly or in full from the area of increased magnetic permeability dependent upon the size of the latter.

In the case of a very large tank such as those installed in the liquid petroleum gas (LPG) and liquid natural gas (LNG) tankers at present being built and those projected for the future, the circuit of the present invention can be included into the insulation or attached to the tank wall in such a manner that the whole insulation system of each tank wall can be monitored by one continuous length of circuit, e.g., in the form of a co-axial cable which can be installed in a serpentine fashion covering the whole area or by a series of individual shorter circuits laid in a suitable fashion and which can be interrogated in turn. When an area of increased magnetic permeability is detected, provided that it is not so large that all of the pulse is reflected, some idea of its dimensions can be obtained by the various reflections as the pulse crosses its edges, i.e., passes alternatively through regions of ferromagnetism and paramagnetism. In order to facilitate this, and the detection of further cold spots beyond a first one, the first area of increased magnetic permeability can be cancelled by the placement of a permanent magnet close to it or a small direct current can be passed along the circuit so as to decrease the incremental permeability of the length of cable affected by the cold spot which will allow the short pulse of voltage to pass further.

The ability of the apparatus of the present invention to respond to a decrease in temperature can be used in order to detect a failure in a vessel or pipe containing a gas or liquid under pressure. In this situation a small hole will allow the contained material to jet from the container and as a result of the Joule Thomson effect, the area surrounding the hole becomes cooled, a well-known phenomenon. The lowering in temperature at this point is detectable by the circuit of the present apparatus in the same manner as a cold spot in an insulation system. In the event of a failure of such a nature as to damage the circuit, this is also detected since a discontinuity is created at the damaged area and the pulse is reflected from it.

Alternatively, the present method and apparatus may be used to detect a failure in a thermal insulation system, where failure can lead to the formation of a hot spot. Hot spots can be especially dangerous because they can become ignition sources. Examples of thermal insulation systems which can be protected by the apparatus of the present invention include those surrounding chemical distillation plants, furnaces, boilers, reaction vessels and heated storage vessels. The method of detecting a failure is similar to that for detecting a failure in a cryogenic insulation system except that the pulse is reflected from a magnetic discontinuity caused by a section of the magnetically soft ferromagnetic material in the proximity of the failure passing through its Curie point and becoming paramagnetic whilst the remainder remains ferromagnetic.

As well as changes in temperature due to insulation failure the method and apparatus of the present invention can also detect a change brought about by an undesirable change in state, for example, caused by faulty heating or cooling equipment, as the result of a chemical reaction going out of control or as the result of an outbreak of fire, or by faulty running equipment due to, for instance, the failure of its bearing.

Figure 2A:
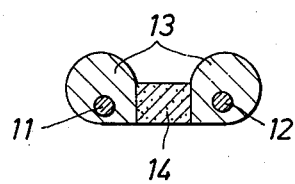
FIGS. 2a-2e illustrate several alternate configurations of the cable used in FIG. 1.

Referring now to the accompanying drawings, FIG. 1 shows apparatus according to the invention, attached to the surface of an insulation system having a fault therein and FIGS. 2a, b, c, d and e show several alternative configurations of cable according to the invention.

FIG. 1 shows a Time Domain Reflectometer (T.D.R.) 1, connected to a cable 2, according to the present invention, which is attached to the surface of an insulation system 3. A failure in the insulation system 3, has caused the formation of a cold spot in the area 4. When a short pulse of voltage is launched along the cable 2, from the T.D.R. 1, and when the cold spot 4 did not exist, the pulse carried on unreflected as far as the end 9, of the cable 2, where it was reflected. When a short pulse of voltage is launched along the cable 2, from the T.D.R. 1, and the cold spot 4, is present, the magnetically soft ferromagnetic material within the cable 2, in the sections between the points 5 and 6, and 7 and 8, in the proximity of the cold spot 4, will pass through its Curie point to become ferromagnetic, and the pulse will see magnetic discontinuities at the points 5, 6, 7 and 8. At the points 5 and 7, the change will be from the paramagnetic to the ferromagnetic state, giving, for example, a positive reflection and at the points 6 and 8, the change will be back from the ferromagnetic to the paramagnetic state, giving an opposite reflection. The various times taken for pulses to travel from the T.D.R. to each of the points 5, 6, 7 and 8, will be displayed and can be permanently recorded. From the times obtained and a knowledge of the speed at which the pulse travels along the cable and back the relative distances along the cable of each of the points 5, 6, 7 and 8, can be calculated. If required, the T.D.R. can be calibrated to read this information directly.

If the pulse is reflected completely from the section 5 to 6, or if the reflections obtained from the section 7 to 8, and subsequent ones are too small for accurate measurement, a permanent magnet, e.g., a flexible filled-plastic magnetic material can be attached near to the section 5 to 6, to cancel out the magnetic discontinuity there, when the pulse will continue substantially unreflected to section 7 to 8, from which a correspondingly larger set of reflections will be obtained. This not only facilitates the "mapping" of the cold spot 4, but also enables subsequent cold spots to be more easily identified.

Considering a ship for transporting LNG, it appears that each side of a tank on the largest LNG carriers would require one continuous length of cable zig-zagged either on its outside surface, or embedded in the thermal insulation. Thus, if the ship has five tanks, and it is desired to minotor the four sides and the bottom of each tank, 25 cables would be needed.

An automatic switching system might examine each cable in turn. Further, it would be an advantage to check for echoes at both ends of each cable. Not only would this be a cross-check on the presence of cold spots, but it would enable a severed or otherwise damaged cable to remain operational until a repair could be effected. A total of 50 switches would therefore be required. Such a coaxial switching system, in a matrix suitable for selection by a minicomputer, is commercially available.

The heart of the system is a "Time Domain Reflectometer" (TDR). It continuously launches a series of pulses down a cable and measures the time for the echoes to be received. It also measures the amplitude of the reflection, thus enabling an estimate to be made of the severity of a cold spot. This information is normally plotted as a trace on a chart or cathode ray tube.

A minicomputer might be a desirable adjunct. This would enable the small echoes which result from very distant cold spots to be unambiguously extracted from background mush. This mush is due to imperfections in the cable itself.

If a minicomputer is employed it will, of course, operate the switches mentioned above the therefore knows which tank and which side it is dealing with at any particular time. It can also convert the distance to a cold spot into a figure in meters together with a second figure indicating the length of cable which is below the Curie point. Such information or a location reference can be displayed on one or more illuminated panels, which can be located at strategic points in the accommodation. Alarm bells can also be sounded.

For example, the display may read:
NO. 4 TANK, PORT, 355 m (0.6 m)

The display can be easily tailored to that considered most suitable for shipboard use both from operational and reliability aspects. If required, the information can be automatically logged on a typewriter, together with the time and date.

The basic chart plotter or cathode ray tube display of the TDR could be retained if required. This could serve as a stand-by system; it could also be useful for trouble shooting.

This system for use onboard ships offers a cold spot detection with good reliability, inherent safety and low installation cost. This is because quite large areas of tank surface can be handled by a single continuous cable, thus eliminating a plethora of electrical joints and a very large number of cable connections to the detection device.

FIGS. 2a, b, c, d and e show examples of alternative configurations for the cable 2, in FIG. 1.

In FIG. 2a, a cable is shown having two parallel conductors 11 and 12, insulated from each other by a dielectric material 13, and having positioned between them a quantity of a magnetically soft ferromagnetic material 14, shown dispersed in a suitable insulating carrier.

Figure 2B:
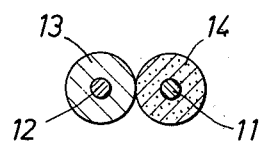

FIG. 2b shows an alternative cable having two parallel conductors 11 and 12, the difference being that the conductor 11 is surrounded by a quantity of a magnetically soft ferromagnetic material 14, dispersed in a suitable insulating carrier, whilst the other conductor 12 is surrounded by an unfilled dielectric material 13.

Figure 2C:
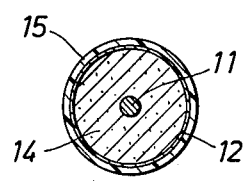

FIG. 2c shows a cable according to a preferred embodiment of the invention, wherein a central core conductor 11 is surrounded by a quantity of a magnetically soft ferromagnetic material dispersed in a suitable dielectric carrier 14, which in turn is surrounded by a second conductor 12, in the form of a woven sheath covered with an electrically non-conductive protective sheath 15.

Figure 2D:
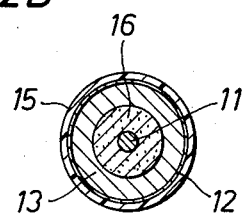
Figure 2E:
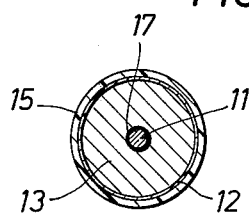

FIGS. 2d and 2e show variations of the co-axial type of cable shown in FIG. 2c. In FIG. 2d, the central conductor 11 is surrounded by a layer 16, consisting of a dielectric insulating material having dispersed therein a very heavy loading of a magnetically soft ferromagnetic material, the loading being such that if the cable were constructed as in 2c, the insulation would be too brittle to be generally useful, and surrounding this a further layer of an unloaded dielectric insulating material 13, further surrounded by a woven sheath conductor 12, protected by an electrically non-conductive protective sheath 15, and in FIG. 2e the central conductor 11 is a relatively thin layer 17 of a magnetically soft ferromagnetic material bonded directly onto its outer surface and this is surrounded by a layer of an insulating carrier 13, surrounded in turn by a woven sheath conductor 12, protected by an electrically non-conductive protective sheath 15.

It will be understood that the word "parallel" is used herein to define any relative disposition of conductors in which said conductors are spaced apart by a substantially constant distance.

We claim:

1. A method for detecting temperature variation above or below a predetermined value, comprising:
   a. transmitting an electrical signal of short duration along an electrical circuit in thermal contact with the area where the temperature variation is to be detected wherein the electrical circuit comprises:
      1. at least two substantially parallel conductors insulated from each other; and
      2. ferromagnetic material having a Curie point about equal to the predetermined temperature positioned between said parallel conductors;
   b. detecting a reflection of the electrical signal; and
   c. measuring the time interval between transmitting the signal and detecting the reflection thereof.

2. The method of detecting temperature variation set forth in claim 1, further comprising:
   calculating from the time interval measurement the length of the electrical circuit along which the electrical signal travelled until the reflection thereof occurred.

3. The method of detecting temperature variation set forth in claim 2, further comprising:
   a. transmitting subsequently a second electrical signal from the other end of the electrical circuit;
   b. detecting a reflection of the second signal;
   c. measuring the time interval between transmitting the second signal and detecting the reflection thereof; and
   d. calculating the length of the electrical circuit along which the second signal travelled until a reflection thereof occurred.

4. The method for detecting temperature variation set forth in claim 3, wherein the electrical signal of short duration comprises:
   a pulse of voltage.

5. The method for detecting temperature variation set forth in claim 4, wherein:
   the substantially parallel conductors are insulated from each other by insulation material and the ferromagnetic material is dispersed in the insulation material.

6. The method of detecting temperature variation according to claim 5, wherein the electrical circuit comprises:
   a co-axial cable.

7. The method of detecting temperature variation set forth in claim 6, wherein the ferromagnetic material comprises:
   soft ferrite material.

8. The method of detecting temperature variation set forth in claim 7, wherein the soft ferrite material comprises:
ferrite powder.

9. The method for detecting temperature variation set forth in claim 1, wherein the electrical signal of short duration comprises:
a pulse of voltage.

10. The method of detecting temperature variation set forth in claim 1, wherein:
the substantially parallel conductors are insulated from each other by insulation material and the ferromagnetic material is dispersed in the insulation material.

11. The method of detecting temperature variation set forth in claim 10, wherein the ferromagnetic material comprises:
soft ferrite material.

12. The method of detecting temperature variation set forth in claim 11, wherein the soft ferrite material comprises:
ferrite powder.

13. The method of detecting temperature variation according to claim 1, wherein the electrical circuit comprises:
a co-axial cable.

14. The method for detecting temperature variation set forth in claim 1, further comprising:
measuring the magnitude of the reflection to determine the extent of temperature variation above or below the predetermined value.

15. The method for detecting temperature variation set forth in claim 1, wherein:
said parallel conductors are elongate and have said ferromagnetic material positioned along substantially the entire length of said parallel elongate conductors.

16. The method for detecting temperature variation set forth in claim 1, further comprising:
locating the area of temperature variation along said electrical circuit by measuring the time interval between the detection of a first reflection of the electrical signal adjacent a first beginning boundary of the temperature variation area and the detection of a second reflection of the electrical signal adjacent a second end boundary of the temperature variation area.

17. The method for detecting temperature variation set forth in claim 16, further comprising:
disposing said electrical circuit in a looped configuration with said electrical circuit having looped ends connecting substantially parallel portions for locating the boundaries of area of temperature variation.

18. Apparatus for detecting temperature variations above or below a predetermined value, comprising:
a. an electrical circuit having at least two substantially parallel conductors, insulating material for insulating said conductors from each other, and a quantity of ferromagnetic material having a Curie point about equivalent to the predetermined temperature situated between said conductors;
b. means for transmitting an electrical signal of short duration along said electrical circuit;
c. means for detecting a reflection of the signal; and
d. means for determining the time interval between the transmission of the signal and the detection of the reflection.

19. The apparatus of claim 18, wherein:
said substantially parallel conductors form a co-axial cable having a central conductor and an outer conductor.

20. The apparatus of claim 19, wherein:
said central conductor is coated with a layer of said ferromagnetic material.

21. The apparatus of claim 20, wherein said insulation material is situated between the coated central conductor and said outer conductor and said insulation material comprises:
a polyethene material.

22. The apparatus of claim 21, wherein said ferromagnetic material comprises:
a soft ferrite material.

23. The apparatus of claim 22, further comprising:
switching means for alternatively connecting said transmitting means, said detecting means, and said measuring means with one end of said electrical circuit and then with the other end thereof.

24. The apparatus of claim 18, wherein:
said ferromagnetic material is dispersed in said insulating material.

25. The apparatus of claim 18, wherein said ferromagnetic material comprises:
a soft ferrite material.

26. The apparatus of claim 18, further comprising:
switching means for alternatively connecting said transmitting means, said detecting means, and said measuring means with one end of said electrical circuit and then with the other end thereof.

27. In a thermally insulated cryogenic storage system having a storage tank, cryogenic insulation and an apparatus for detecting failures, wherein the improvement comprises:
a. an apparatus for detecting failures which detects temperature variations above or below a predetermined value comprising:
1. an electrical circuit having at least two substantially parallel conductors insulated from each other and a quantity of ferromagnetic material having a Curie point about equivalent to the predetermined temperature situated between said conductors;
2. means for transmitting an electrical signal of short duration along said electrical circuit;
3. means for detecting a reflection of the signal; and
4. means for determining the time interval between the transmission of the signal and the detection of the reflection.

28. The system of claim 27, wherein:
said substantially parallel conductors form a co-axial cable having a central conductor coated with a layer of said ferromagnetic material.

29. In a thermally insulated pipeline system designed for the transportation of gas having a pipeline and apparatus for detecting a failure or leak in the pipeline, wherein the improvement comprises:
a. an apparatus for detecting failures which detects temperature variations above or below a predetermined value, comprising:
1. an electrical circuit having at least two substantially parallel conductors insulated from each other and a quantity of ferromagnetic material having a Curie point about equivalent to the predetermined temperature situated between said conductors;

2. means for transmitting an electrical signal of short duration along said electrical circuit;
3. means for detecting a reflection of the signal; and
4. means for determining the time interval between the transmission of the signal and the detection of the reflection.

30. The system of claim 29, wherein:
said substantially parallel conductors form a co-axial cable having a central conductor coated with a layer of said ferromagnetic material.

* * * * *